United States Patent
Bour et al.

(10) Patent No.: US 8,569,153 B2
(45) Date of Patent: Oct. 29, 2013

(54) METHOD AND SYSTEM FOR CARBON DOPING CONTROL IN GALLIUM NITRIDE BASED DEVICES

(75) Inventors: David P. Bour, Cupertino, CA (US); Thomas R. Prunty, Santa Clara, CA (US); Linda Romano, Sunnyvale, CA (US); Richard J. Brown, Los Gatos, CA (US); Isik C. Kizilyalli, San Francisco, CA (US); Hui Nie, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 152 days.

(21) Appl. No.: 13/307,108

(22) Filed: Nov. 30, 2011

(65) Prior Publication Data

US 2013/0137225 A1    May 30, 2013

(51) Int. Cl.
*H01L 21/20* (2006.01)
*H01L 21/337* (2006.01)

(52) U.S. Cl.
USPC ............... 438/488; 438/192; 438/503

(58) Field of Classification Search
None
See application file for complete search history.

*Primary Examiner* — Scott B Geyer
(74) *Attorney, Agent, or Firm* — Kilpatrick, Townsend & Stockton LLP (57) ABSTRACT

A method of growing an n-type III-nitride-based epitaxial layer includes providing a substrate in an epitaxial growth reactor, forming a masking material coupled to a portion of a surface of the substrate, and flowing a first gas into the epitaxial growth reactor. The first gas includes a group III element and carbon. The method further comprises flowing a second gas into the epitaxial growth reactor. The second gas includes a group V element, and a molar ratio of the group V element to the group III element is at least 5,000. The method also includes growing the n-type III-nitride-based epitaxial layer.

21 Claims, 5 Drawing Sheets

METHOD AND SYSTEM FOR CARBON DOPING CONTROL IN GALLIUM NITRIDE BASED DEVICES

BACKGROUND OF THE INVENTION

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to methods and systems for controlling the density of carbon in gallium nitride (GaN) semiconductor devices. Merely by way of example, the invention has been applied to methods and systems for controlling carbon density in high voltage GaN devices with vertical drift regions. The methods and techniques can be applied to a variety of compound semiconductor systems including transistors, diodes, thyristors, and the like.

Embodiments of the present invention reduce background carbon incorporation in epitaxial films, enabling the epitaxial growth of thick vertical drift layers characterized by low dopant concentrations and high breakdown voltages. As described below, the ability to reduce the background level of carbon concentration enables increased precision in the control of dopant concentration at low concentration levels, which enables high levels of device performance.

According to an embodiment of the present invention, a method of growing an n-type III-nitride-based epitaxial layer is provided. The method includes providing a substrate in an epitaxial growth reactor, forming a masking material coupled to a portion of a surface of the substrate, and flowing a first gas into the epitaxial growth reactor. The first gas includes a group III element and carbon. The method further comprises flowing a second gas into the epitaxial growth reactor. The second gas includes a group V element, and a molar ratio of the group V element to the group III element is at least 5,000. The method also includes growing the n-type III-nitride-based epitaxial layer.

According to another embodiment of the present invention, a method of manufacturing a vertical JFET is provided. The method includes providing an n-type GaN-based substrate having a surface and a first electrical contact opposing the surface, forming an epitaxial n-type drift layer coupled to at least a portion of the n-type GaN-based substrate and operable to conduct current in a direction substantially orthogonal to the surface, and forming a masking material coupled to a portion of the epitaxial n-type drift layer. The method further includes forming an n-type channel structure coupled to the epitaxial n-type drift layer. Gases including a group V element and a group III element used in forming the n-type channel structure are adjusted such that a molar ratio of the group V element to the group III element is at least 5,000. The method also includes forming an n-type contact layer coupled to the n-type channel structure and substantially parallel to the surface, forming a second electrical contact electrically coupled to the n-type contact layer, forming a p-type gate region electrically coupled to the n-type channel structure, forming a third electrical contact electrically coupled to the p-type gate region.

According to yet another embodiment of the present invention, a method of growing an n-type GaN-based epitaxial layer is provided. The method includes placing a GaN-based substrate in an MOCVD reactor, forming an oxide coupled to a portion of a surface of the GaN-based substrate, and flowing a gas containing gallium and carbon into the MOCVD reactor. The method further includes flowing a gas containing nitrogen into the MOCVD reactor. A molar ratio of nitrogen to gallium is at least 5,000. Finally, the method includes growing the n-type GaN-based epitaxial layer.

Numerous benefits are achieved by way of the present invention over conventional techniques. For example, embodiments of the present invention provide vertical device geometries that conserve valuable wafer area, since the portion of the device that supports high voltages (e.g., the drift region of a transistor or diode), is based on the vertical thickness of an epitaxially grown layer, not by the horizontal extent of the device. Embodiments of the present invention provide homoepitaxial GaN layers on bulk GaN substrates that are imbued with superior properties to other materials used for power electronic devices. High electron mobility, $\mu$, is associated with a given doping level, N, which results in low resistivity, p, since $p=1/q\mu N$, and low on-state resistance.

Another beneficial property provided by embodiments of the present invention is a high critical electric field, $E_{crit}$, for avalanche breakdown. A high critical electric field allows large voltages to be supported over a smaller length, L, than a material with lesser $E_{crit}$. A shorter distance for current to flow and a low resistivity give rise to a lower resistance, R, than conventional high voltage devices since $R=\rho L/A$, where A is the cross-sectional area of the channel, or current path. For a high voltage device with the drift region oriented vertically, more unit cells can be packed into an area of the wafer than a lateral device of the same voltage rating. More unit cells lead to increased width of the current path, and thus larger cross-sectional area, which reduces resistance in the channel. In addition, GaN layers grown on bulk GaN substrates have low defect density compared to layers grown on mismatched substrates. The low defect density results in superior thermal conductivity, less trap related effects such as dynamic on-resistance, lower leakage currents, and increased reliability.

The ability to obtain regions that can support high voltage with low resistance compared to similar device structures in other materials allows embodiments of the present invention to provide resistance properties and voltage capability of conventional devices, while using significantly less area for the GaN device. Capacitance, C, scales with area, approximated as $C=\epsilon A/t$, so the smaller device will have less terminal-to-terminal capacitance. Lower capacitance leads to faster switching and less switching power loss.

As described below, the ability to create a vertical device in GaN grown on bulk GaN substrates enables a smaller active area device with the same voltage handling capability and same on-state resistance as a larger device in conventional material systems. Conversely, a device of the same size will possess lower on-state resistance with the same voltage blocking capability and capacitance.

These and other embodiments of the invention along with many of its advantages and features are described in more detail in conjunction with the text below and attached figures.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

Embodiments of the present invention relate to electronic devices. More specifically, the present invention relates to methods and systems for controlling background carbon density in semiconductor devices. Merely by way of example, the invention has been applied to methods and systems for controlling doping in high voltage GaN devices with vertical drift regions. The methods and techniques can be applied to a variety of compound semiconductor systems including transistors, diodes, thyristors, and the like.

As described more fully throughout the present specification, the fabrication of GaN epitaxial layer(s) on GaN-based substrates, including pseudo-bulk GaN substrates, enables vertical device concepts in the GaN material system according to embodiments of the present invention. Devices operated in high voltage regimes, typically referred to as high voltage devices, are provided with doping control for the drift region according to embodiments of the present invention such that relatively low volumetric levels of dopants are achieved. Since the maximum electric field is a function of the doping profile, embodiments described herein are able to operate at higher voltages than conventional devices. Embodiments utilize low-strain films that are grown on native substrates and are therefore characterized by reduced or zero lattice mismatch. Such layers can be grown to thicknesses not generally available using conventional techniques, enabling high power operation in vertical configurations. As described herein, GaN material properties enable thinner drift regions for a given voltage rating and are characterized by a high carrier mobility compared to other materials.

Although some embodiments are discussed in terms of GaN substrates and GaN epitaxial layers, the present invention is not limited to these particular binary III-V materials and may be applicable to a broader class of III-V materials, in particular III-nitride materials. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, Sn, and the like. Additionally, other III-nitride materials in addition to GaN are included within the scope of the present invention, including, but not limited to, other binary III-nitride materials, ternary III-nitride materials, such as InGaN and AlGaN, quaternary III-nitride materials, such as AlInGaN, doped versions of these materials, and the like. The substrates discussed herein can include a single material system or multiple material systems including composite structures of multiple layers. One of ordinary skill in the art would recognize many variations, modifications, and alternatives.

Applications that can utilize the vertical drift regions described herein are many, with commercial markets including high voltage switched mode power supplies, power factor correction devices, DC-AC inverters, DC-DC boost converters, various other circuit topologies, and the like. The inventors have determined that devices fabricated utilizing the methods and systems described herein for reducing background carbon density have the potential to provide benefits and performance not available using conventional solutions, including solutions based on silicon carbide (SiC) technology. Because conventional GaN-based devices, such as lasers, light-emitting diodes (LEDs), and even metal-oxide-semiconductor field-effect transistors (MOSFETs), do not utilize the relatively lightly-doped drift regions described herein, background carbon density has typically been ignored.

High quality GaN grown on native substrates can be characterized by a low defect density ($<10^6$ cm$^{-3}$) and a related high electron mobility, resulting in low forward conduction loss. Due to the high critical electric field of GaN, drift regions may be kept relatively thin, while blocking high voltages, which will also allow low forward conduction loss. For a given doping level, the drift layer thickness is preferably large enough to accommodate the full depletion width at the breakdown voltage ($V_{BR}$). According to some embodiments, the drift region is lightly doped (e.g., on the order of $1\times10^{14}$ to $1\times10^{18}$ cm$^{-3}$) and the thickness of the drift region measured along the direction of current flow is reduced to minimize unnecessary series resistance.

Embodiments of the present invention provide methods and systems that relate to basic building blocks useful in vertical, high voltage devices fabricated using GaN-based material systems. These building blocks include, but are not limited to, layer thicknesses, concentrations of donor and/or acceptor dopants, and the like. Merely by way of example, the doping concentration and thickness of a drift layer in a vertical transistor or other device employing a drift region are controlled using the embodiments described herein.

The inventors have determined that designs for vertical drift layers, which can range in thickness from one or several microns to over one hundred microns, and associated drift regions, can benefit from precise control over the concentration of dopants (i.e. doping concentration) in these vertical drift layers, particularly in high voltage applications. For example, Table 1 lists doping concentrations and depletion widths of the drift region for breakdown voltages from 600 V to 13.6 kV.

TABLE 1

| $V_{BR}$ (V) | Doping Concentration (cm$^{-3}$) | $t_{drift}$ (μm) |
|---|---|---|
| 600 | 4.75E+16 | 3.7 |
| 1200 | 2.38E+16 | 7.3 |
| 1800 | 1.59E+16 | 10.9 |
| 2400 | 1.19E+16 | 14.6 |
| 3200 | 8.94E+15 | 19.4 |
| 4000 | 7.16E+15 | 24.2 |
| 4800 | 5.96E+15 | 29.1 |
| 5600 | 5.10E+15 | 34.0 |
| 6400 | 4.47E+15 | 38.8 |
| 7200 | 3.97E+15 | 43.7 |
| 8000 | 3.58E+15 | 48.5 |
| 8800 | 3.25E+15 | 53.4 |
| 9600 | 2.92E+15 | 59.4 |
| 10400 | 2.75E+15 | 63.1 |
| 11200 | 2.56E+15 | 67.9 |
| 12000 | 2.38E+15 | 72.8 |
| 12800 | 2.24E+15 | 77.6 |
| 13600 | 2.10E+15 | 82.5 |

Figure 1A:
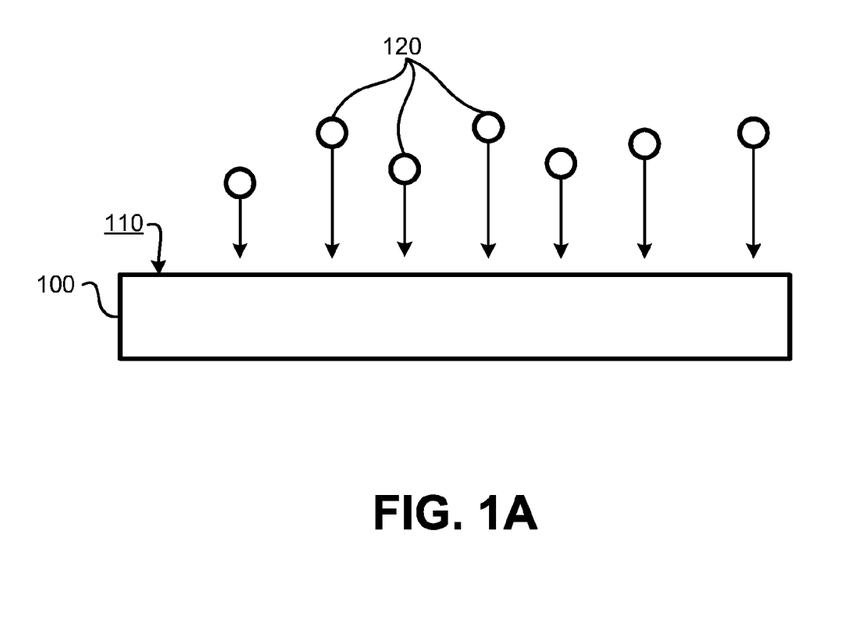
FIG. 1A is a simplified cross-sectional diagram illustrating the formation of a GaN epitaxial layer on a substrate through a uniform epitaxial growth process.
Figure 1B:
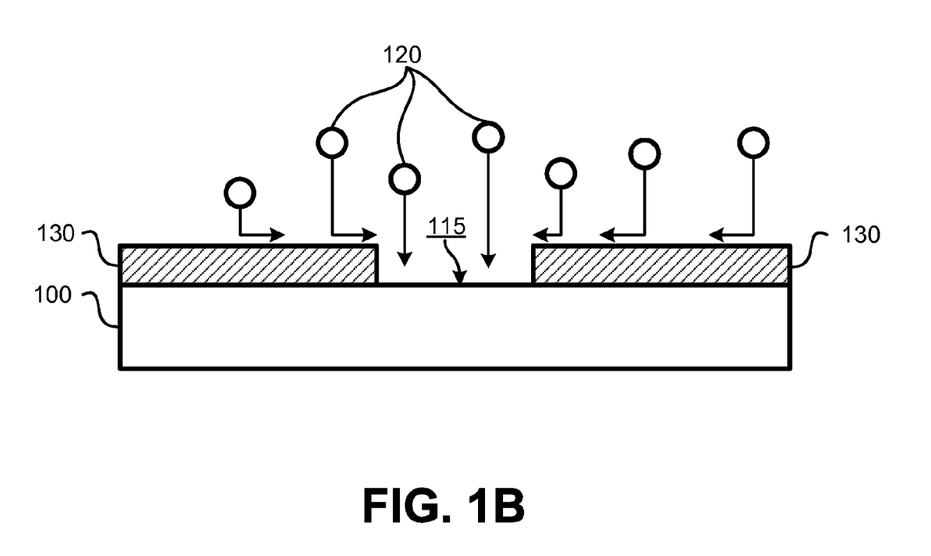
FIG. 1B is a simplified cross-sectional diagram illustrating the formation of a GaN epitaxial layer on a substrate through a selective epitaxial growth process.

FIGS. 1A and 1B are simplified cross-sectional diagrams illustrating embodiments of the formation of a GaN epitaxial layer on a substrate 100 through respective uniform and selective growth processes. It will be understood that FIGS. 1A and 1B are for illustrative purposes only, and are not intended to reflect all processes involved in how precursor gases decompose and react to form the resultant epitaxial layer.

The most common epitaxial growth methods are metal organic chemical vapor deposition (MOCVD), metal organic vapor phase epitaxy, and metal organic molecular beam epitaxy. During the epitaxy process, metalorganic precursors are utilized to provide the Group III elements incorporated into the III-nitride epitaxial structure. For example, carbon produced from the metalorganic precursors, for example, trimethyl gallium, triethyl gallium, trimethyl aluminum, triethyl aluminum, or the like, can be unintentionally incorporated into a GaN-based crystal lattice. When carbon is incorporated into the GaN-based drift layer during the drift layer epitaxial process, the carbon incorporation can cause acceptor-like background doping levels of, for example, between $1 \times 10^{16}$ cm$^{-3}$ and $1 \times 10^{18}$ cm$^{-3}$, particularly $3 \times 10^{16}$ cm$^{-3}$. This is particularly troublesome to n-type drift layers, where doping control is important in realizing high voltage operation. The unintended background doping can compensate intentional n-type doping (e.g., silicon doping) introduced during drift layer epitaxial growth, making it difficult to achieve the n-type dopant concentrations shown in Table 1.

In a uniform epitaxial growth process, such as that shown in FIG. 1A, the growth species 120 interacts with the surface 110 to cause epitaxial growth on an entire surface 110 of a substrate 100. As stated above, carbon included in a metalorganic Group III precursor is incorporated into the resultant epitaxial layer. However, embodiments of the present invention reduce carbon levels in the resultant epitaxial layer, for example, using chemical reactions between the carbon and ambient elements and/or molecules in the growth chamber. Atomic hydrogen from the Group V precursor (e.g., ammonia), for example, can react with the carbon in the resultant epitaxial layer and surface species to form methane, which can be removed from the growth chamber. By increasing the VIII ratio, that is, the molar ratio of the Group V element precursor (e.g., ammonia (NH$_3$)) to the Group III element precursor more atomic hydrogen can be formed. This results in lower carbon levels in the resultant epitaxial layer. However, increasing the VIII ratio in a uniform epitaxial growth process to a degree that would result in significantly lower carbon levels would typically require reducing the Group III precursor flow, and thus can cause the growth process to be prohibitively slow and inefficient.

In a selective epitaxial growth process, such as that shown in FIG. 1B, masks 130 are used such that the growth species 120 causes epitaxial growth only on exposed surface 115 of the substrate 100. The masks 130, which can be made of refractory oxides or other materials that inhibit nucleation, for example SiO or SiON, not only prevent growth of the resultant epitaxial layer on areas of the substrate 130 to which the masks 130 are coupled, but also increase the growth rate of the epitaxial layer on the exposed surface 115. As illustrated in FIG. 1B, through processes such as surface migration, evaporation, and/or vapor diffusion, the growth species 120 migrate to unmasked areas and form an epitaxial layer on the exposed surface 115 much more quickly than corresponding uniform epitaxial growth processes, such as that shown in FIG. 1A. Although the speed of the selective epitaxial growth process can vary depending on various factors, such as the amount of area of the substrate 100 covered by the masks 130, growth rates of the resultant epitaxial layer in selective epitaxial growth processes can be much faster than growth rates in corresponding uniform epitaxial growth processes. In some embodiments, the growth rate is at least 2 times faster, and rates of 10 times faster or more can be achieved.

Embodiments of the present invention take advantage of this phenomenon to reduce carbon incorporation in n-type epitaxial layers, enabling low n-type doping for high breakdown voltage devices. According to embodiments of the present invention, masks 130 are used to cover all areas of the substrate 100 except those on which an epitaxial layer with low carbon doping is to be formed. Additionally, the flow of precursor gases can be adjusted such that the VIII ratio is increased substantially. The slowdown in the growth rate due to the increased VIII ratio is offset by the increased growth rate due to the selective epitaxial growth process. Thus, the corresponding growth rate of the resultant n-type epitaxial layer is similar to the growth rate of a uniform epitaxial growth process. In some embodiments, for example, the growth rate is between 1 and 2 μm/hr. The resultant n-type epitaxial layer, however, can have much less carbon than one made from conventional epitaxial processes. Moreover, carbon reduction may additionally be promoted due to growth species such as ammonia and trimethylgallium being better pyrolyzed or thermally activated due to their greater residence time in the thermal boundary layer.

Figure 2:
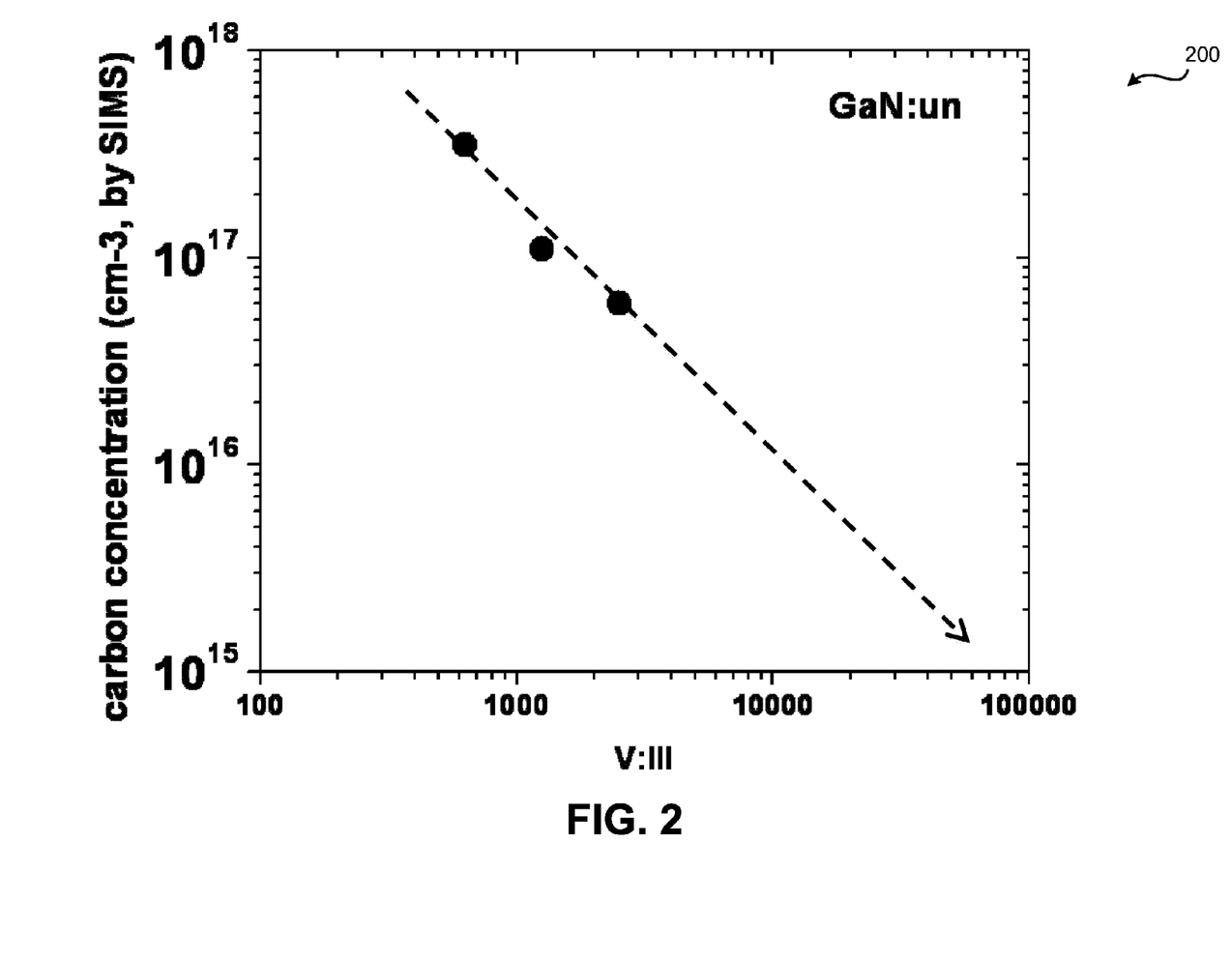
FIG. 2 is a graph that illustrates carbon concentration as a function of V/III ratio for an exemplary n-type GaN epitaxial growth process according to an embodiment of the present invention.

FIG. 2 is a graph 200 that illustrates the carbon concentration as a function of VIII ratio for an example n-type GaN epitaxial growth process. Conventional epitaxial growth processes utilized VIII ratios of typically 2,500 or less, resulting in carbon concentrations in the resultant n-type epitaxial layer around $1 \times 10^{17}$ cm$^{-3}$. Embodiments of the present invention, however can utilize VIII ratios of at least 5,000. Specific VIII ratios can include 5,000; 10,000; 15,000; 20,000; 25,000; or greater. As shown in the graph 200, carbon concentrations in the resultant n-type epitaxial layers at these VIII ratios can be approximately $2 \times 10^{16}$ cm$^{-3}$, $1 \times 10^{16}$ cm$^{-3}$, or less.

Figure 3:
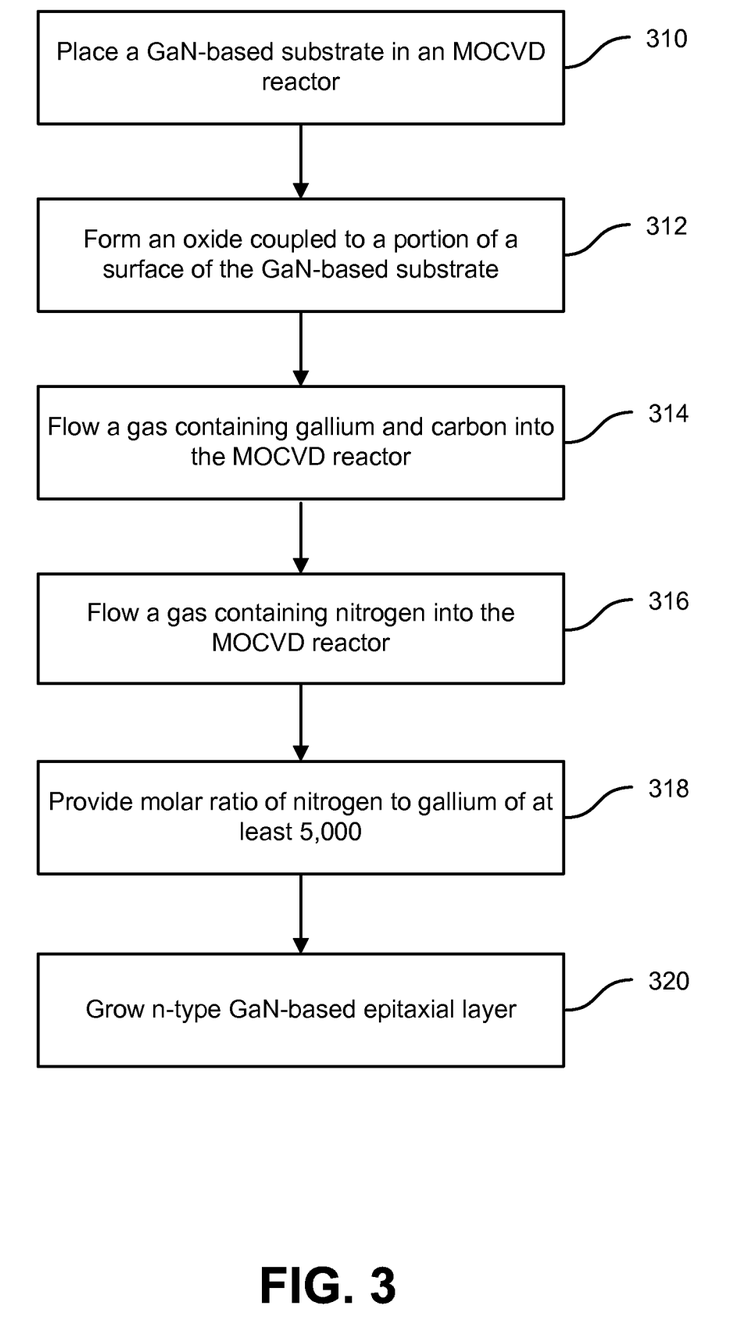
FIG. 3 is a simplified flowchart illustrating a method of fabricating an n-type GaN-based epitaxial layer with reduced carbon concentration according to an embodiment of the present invention.

FIG. 3 is a simplified flowchart illustrating a method of fabricating an n-type GaN-based epitaxial layer with reduced carbon concentration according to an embodiment of the present invention. The method includes placing a GaN-based substrate in an MOCVD reactor (310). The GaN-based substrate can be a doped n-type GaN substrate or other suitable substrate including one or more existing epitaxial layers.

The method also includes forming an oxide coupled to a portion of a surface of the GaN-based substrate (312). Depending on the type of GaN-based semiconductor device to be formed (e.g., Schottky barrier diode, vertical JFET, etc.), some or all of the oxide may comprise portions of the device itself. Alternatively, the oxide may be used only as a mask during the subsequent selective epitaxial growth process and removed after the process is complete. As stated elsewhere herein, the relative amount of surface area of the substrate covered by the oxide can impact the growth rate of the selective epitaxial growth process.

The method further includes flowing a gas containing gallium and carbon (314), and a gas containing nitrogen (316) into the MOCVD reactor, such that the molar ratio of nitrogen to gallium (i.e., the V/III ratio) is at least 5,000 (318). Under these conditions, the resultant n-type GaN-based epitaxial layer that is grown (320) will have a relatively low carbon content. As an example, depending on the V/III ratio utilized, the resultant n-type GaN epitaxial layer can have a carbon concentration between from about $1 \times 10^{15}$ cm$^{-3}$ to about $2 \times 10^{16}$ cm$^{-3}$. As illustrated by the graph 200 of FIG. 2, lower carbon concentrations can be achieved with higher V/III ratios.

A variety of gases can be utilized during the growth process, including a gas containing nitrogen that includes at least one of ammonia or cracked ammonia, and a gas containing gallium that includes at least one of tri-methyl gallium (TMG), tri-ethyl gallium (TEG), cracked tri-methyl gallium, or cracked tri-ethyl gallium.

It should be appreciated that the specific steps illustrated in FIG. 3 provide a particular method of fabricating an n-type GaN epitaxial layer according to an embodiment of the present invention. Other sequences of steps may also be performed according to alternative embodiments. For example, alternative embodiments of the present invention may perform the steps outlined above in a different order. Moreover, the individual steps illustrated in FIG. 3 may include multiple sub-steps that may be performed in various sequences as appropriate to the individual step. Furthermore, additional steps may be added or removed depending on the particular applications. One of ordinary skill in the art would recognize many variations, modifications, and alternatives.

In some embodiments, a precursor that replaces some or all of the carbon-bearing groups with non-carbon-bearing groups, such as gallium chloride or diethyl gallium chloride, is used in addition to a typical gallium precursor such as TMG in a process utilizing organic precursors, such as MOCVD. In some embodiments, low doped n-type GaN-based layers are grown with a gallium precursor that is 100% gallium chloride or diethyl gallium chloride, or a mixture of gallium chloride or diethyl gallium chloride and one or both of TEG and TMG. Low doped n-type GaN-based layers grown with gallium chloride or diethyl gallium chloride as all or part of the gallium precursor may have a carbon concentration less than $10^{17}$ cm$^{-3}$ in some embodiments, less than $10^{16}$ cm$^{-3}$ in some embodiments, or less than $10^{15}$ cm$^{-3}$ in some embodiments of the invention.

Various methods for reducing carbon incorporation in III-nitride material may be combined. For example, in some embodiments, GaN is grown using both a precursor that results in less carbon present during growth, such as TEG, gallium chloride, or diethyl gallium chloride, and a material that inhibits carbon from incorporating in the III-nitride crystal, such as an indium-containing gas. The use of materials that inhibit carbon incorporation during epitaxial growth is discussed in more detail in commonly-assigned U.S. patent application Ser. No. 13/198,661, filed on Aug. 4, 2011, the disclosure of which is hereby incorporated by reference in its entirety.

Figure 4:
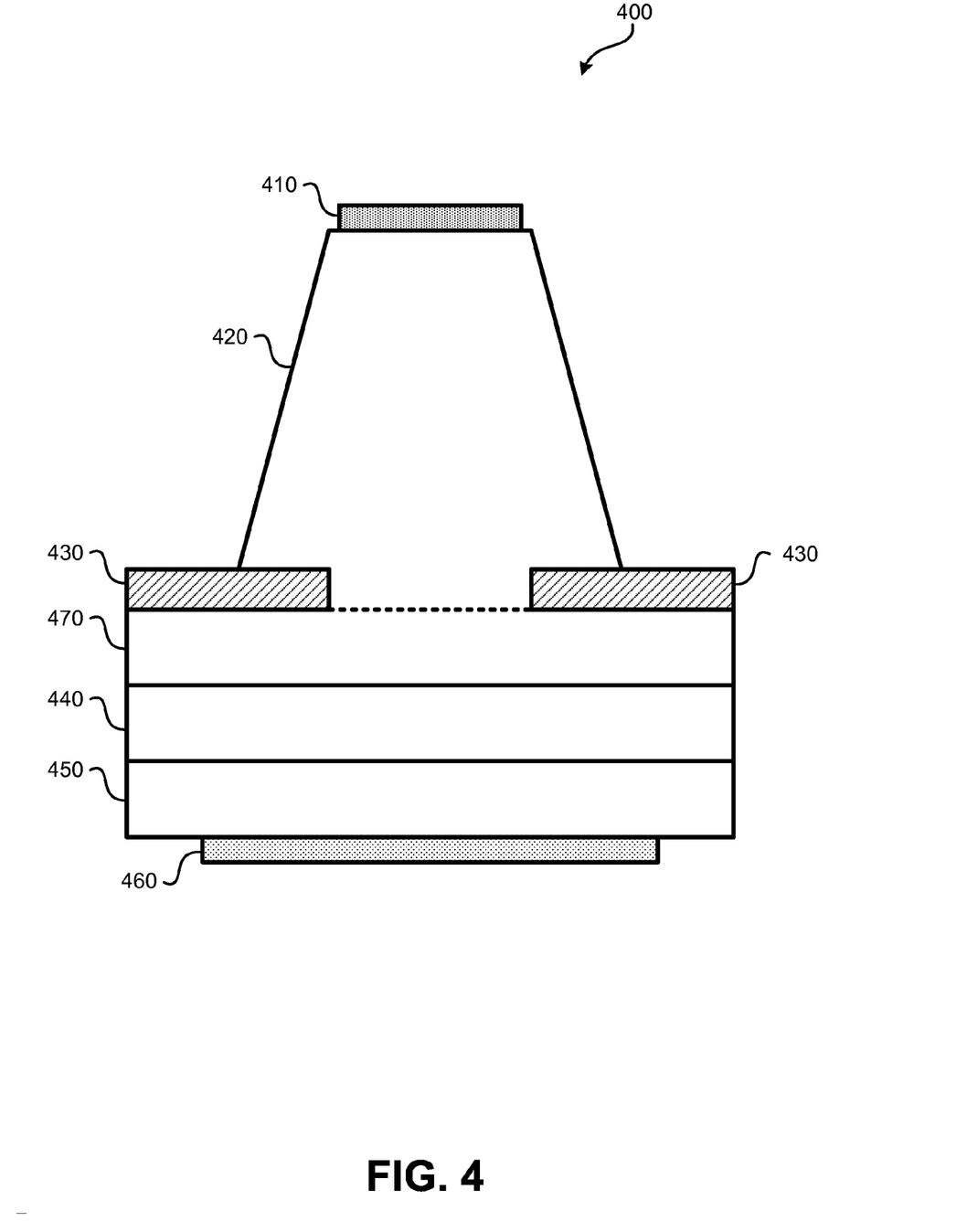
FIG. 4 is a simplified schematic cross-section of a Schottky barrier diode (SBD), according to an embodiment of the present invention.

FIG. 4 is a simplified schematic cross-section of a Schottky barrier diode (SBD) 400 according to an embodiment of the present invention. The SBD 400 is referred to as a vertical device because the current flow through the SBD 400 is in a vertical direction that is substantially orthogonal to the growth direction of the various epitaxial layers included in the device.

The SBD 400 includes a III-nitride substrate 450 illustrated as a n+ GaN substrate. An additional epitaxial layer 440, such as an n+ GaN layer, can be coupled to the III-nitride substrate 450. A low-doped III-nitride epitaxial layer 470, such as an n− GaN epitaxial layer, can be coupled to the additional epitaxial layer 440.

Silicon dioxide structures 430 (or other dielectric structures) can be coupled to the low-doped III-nitride epitaxial layer 470 and serve as a mask for epitaxial growth of a low-doped drift region structure 420. In some embodiments, however, the a low-doped III-nitride epitaxial layer 470 may be omitted, in which case the silicon dioxide structures can be coupled to the additional epitaxial layer 440. The thickness of the silicon dioxide structures 430 can be adjusted, according to desired functionality, manufacturing concerns, and other such factors. Broadly speaking, a minimum thickness may be governed by a minimum thickness required to form a continuous mask for epitaxial growth. A maximum thickness may be governed by stress and/or other issues associated with larger thicknesses. While some embodiments include thicknesses of between 100 and 200 nm, other embodiments include thicknesses of as little as 5 nm or less, or as large as 1 µm or more.

The drift region structure 420, together with the low-doped III-nitride epitaxial layer 470, forms the drift region of the SBD 400. The drift region structure 420 can be formed in a selective epitaxial growth process as described herein. The resulting low carbon levels allow for low overall n-type doping of the drift region structure 420, which enables high-voltage operation of the SBD 400. For high power operation, the combined thickness of the low-doped III-nitride epitaxial layer 470 can be relatively thick in order to support a large breakdown voltage drift region structure 420. In typical embodiments, the combined thickness can be between about 1 µm to about 100 µm and the doping concentration can be between about $1 \times 10^{14}$ cm$^{-3}$ to about $1 \times 10^{17}$ cm$^{-3}$. Lower doping enables high voltage operation.

An ohmic contact 460 is electrically coupled to the III-nitride substrate 450. The ohmic contact 460 can be one or more layers of ohmic metal that serve as an electrical contact for the cathode of the SBD 400. For example, the ohmic contact 460 can comprise a titanium-aluminum (Ti/Al) ohmic metal. Other metals and/or alloys can be used including, but not limited to, aluminum, nickel, gold, combinations thereof, or the like. In some embodiments, an outermost metal of the ohmic contact 460 can include gold, tantalum, tungsten, palladium, silver, or aluminum, combinations thereof, and the like. The ohmic contact 460 can be formed using any of a variety of methods such as sputtering, evaporation, or the like.

The SBD 400 illustrated in FIG. 4 further includes a Schottky contact 410 electrically coupled to the drift region structure 420. In some embodiments, a surface of the drift region structure 420 to which the Schottky contact 410 is coupled can be treated to place it in a condition suitable to create a Schottky barrier. The Schottky contact 410 comprises one or more Schottky metals that are deposited and patterned to form the Schottky contact 410. Examples of Schottky metals include nickel, palladium, platinum, combinations thereof, or the like. The geometry of the various components of the SBD 400 can vary depending on desired functionality. One of ordinary skill in the art would recognize many variations, modifications, and alternatives.

Figure 5:
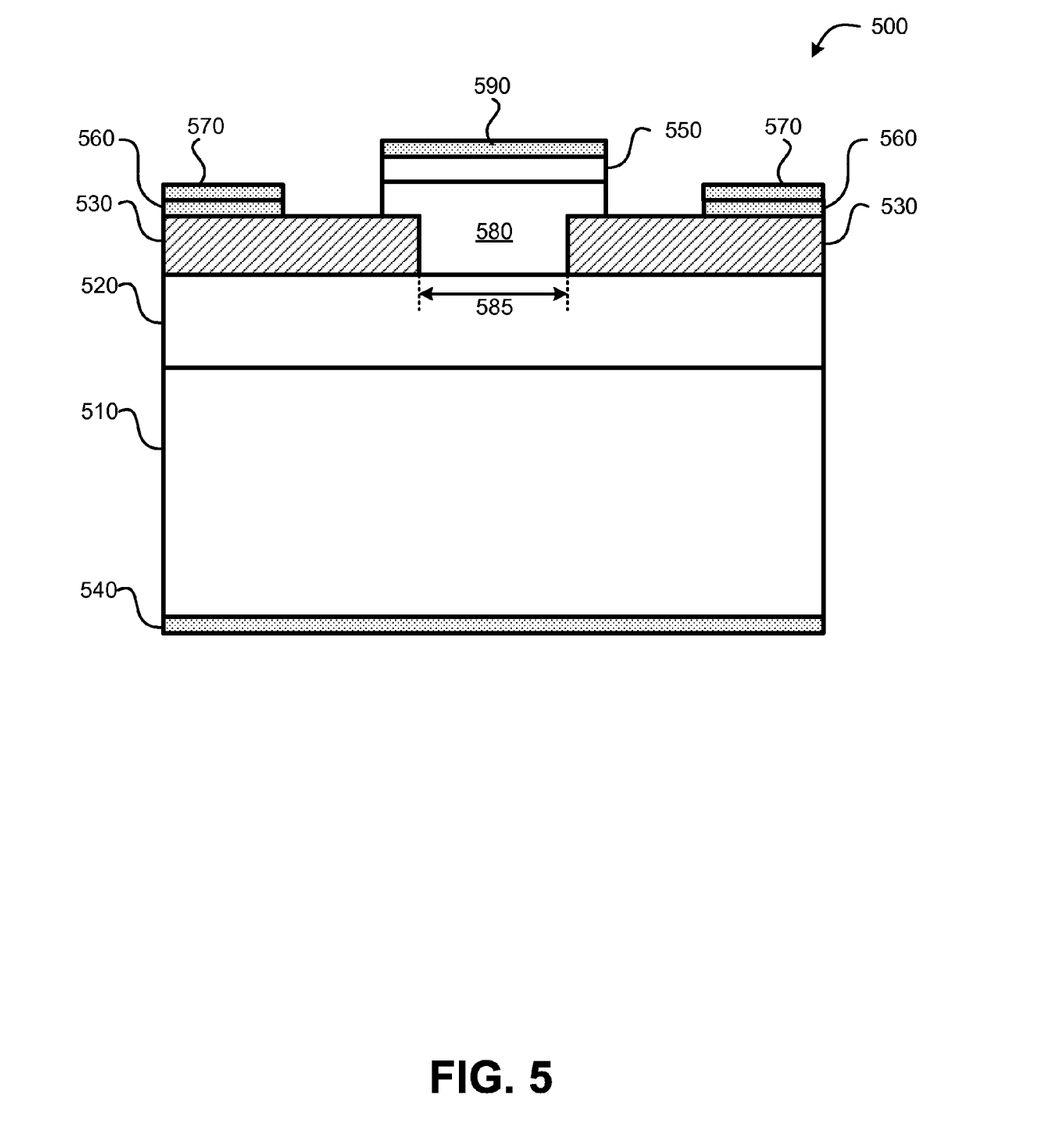
FIG. 5 is a simplified schematic cross-section of a GaN-based vertical junction field-effect transistor (JFET) with a regrown channel region according to an embodiment of the present invention.

FIG. 5 is a simplified schematic cross-section of a GaN-based vertical junction field-effect transistor (JFET) 500 with a GaN channel region 580, according to an embodiment of the present invention. Like the SBD 400 of FIG. 4, the vertical JFET 500 is a vertical device, with current flow through the vertical JFET 500 in a vertical direction that is substantially orthogonal to the growth direction of the various epitaxial layers included in the device.

A first GaN epitaxial layer 520 is formed on a GaN substrate 510, creating a drift region for the vertical JFET 500. The first GaN epitaxial layer 520 can have, for example, relatively low n-type doping, and may be formed using the selective epitaxial growth processes described herein. The GaN substrate 510 can be a GaN bulk or pseudo-bulk substrate with higher dopant concentration than the first GaN epitaxial layer 520, with the same electrical conductivity type. In typical embodiments, the thickness of first GaN epitaxial layer 520 can be between about 1 µm to about 100 µm and the doping concentration can be between about $1\times10^{14}$ $cm^{-3}$ to about $1\times10^{17}$ $cm^{-3}$. In other embodiments, the thickness and doping concentration are modified as appropriate to the particular application. Additional description related to thicknesses, dopant concentrations, and breakdown voltages of the drift layer are provided in U.S. patent application Ser. No. 13/198,655, filed on Aug. 4, 2011, the disclosure of which is hereby incorporated by reference in its entirety.

A second GaN epitaxial layer 530 can be formed above the first GaN epitaxial layer 520. The second GaN epitaxial layer 530, which can comprise the gate of the vertical JFET 500, can be a highly-doped epitaxial layer of a different conductivity type from the first GaN epitaxial layer 520. In an n-channel vertical JFET, for example, the second GaN epitaxial layer 530 can comprise a p+ GaN epitaxial layer, and the first GaN epitaxial layer 520 can include an n− GaN epitaxial layer.

The thickness of the second GaN epitaxial layer 530 can vary, depending on the process used to form the layer and the device design. In some embodiments, the thickness of the second GaN epitaxial layer 530 is between 0.1 µm and 5 µm. In other embodiments, the thickness of the second GaN epitaxial layer 530 is between 0.3 µm and 1 µm The second GaN epitaxial layer 530 can be highly doped, for example in a range from about $5\times10^{17}$ $cm^{-3}$ to about $1\times10^{19}$ $cm^{-3}$. Additionally, as with other epitaxial layers, the dopant concentration of the second GaN epitaxial layer 530 can be uniform or non-uniform as a function of thickness. In one embodiment, a non-uniform dopant concentrations can provide higher dopant concentrations at the top of the second GaN epitaxial layer 530 where metal contacts subsequently can be formed.

At least a portion of the second GaN epitaxial layer 530 can be removed to provide an opening to the first GaN epitaxial layer 520 in which the a GaN channel region 580 can be formed. The removal can be configured to stop at the surface of the first GaN epitaxial layer 520, although removal, such as etching, may penetrate a portion of the first GaN epitaxial layer 520. ICP etching and/or other appropriate GaN etching processes can be used. Additionally, some or all of the masks used in an etching process may be subsequently used as masks in the selective epitaxial growth of the GaN channel region 580.

Dimensions of the removed portion(s) of the second GaN epitaxial layer 530 define the channel width 585 of the vertical JFET 500. The channel width 585 of the vertical JFET 500 can vary, depending on various factors such as desired functionality of the vertical JFET 500, dopant concentrations of the channel region, and the like. For example, a normally-off vertical JFET can have a channel width of less than 3 µm, less than 5 µm, or less than 10 µm, with some embodiments having a channel width between 0.5 µm and 3 µm. For a normally-on JFET, the channel width can be greater.

The GaN channel region 580 can be formed by using the selective epitaxial growth processes described herein on the exposed surface of the first GaN epitaxial layer 520. Because the regrowth process can include lateral growth, the GaN channel region 580 can extend over at least a portion of one or more upper surface(s) of the second GaN epitaxial layer 530 if the thickness of the GaN channel region 580 exceeds the thickness of the second GaN epitaxial layer 530 and the masks used in the selective epitaxial growth process allow. Such lateral growth can be acceptable in many vertical JFET applications.

A GaN epitaxial structure 550 can be formed above the GaN channel region 580. The GaN epitaxial structure 550, which eventually can comprise the source of the vertical JFET 500, can be a highly doped epitaxial layer of the same conductivity type as the first GaN epitaxial layer 520 and the GaN channel region 580. In general, the dopant concentration of the GaN epitaxial structure 550 can exceed the dopant concentrations of the first GaN epitaxial layer and GaN channel region 580. For example, an n-type dopant concentration of the GaN epitaxial structure 550 can be equal to or greater than $1\times10^{18}$ $cm^{-3}$.

The thickness of the GaN epitaxial structure 550 can impact the contact resistance and current flow properties of the vertical JFET 500. In some embodiments, thicknesses can be between 500 Å and 5 µm, for example 2 µm. In other embodiments, the thickness of the third GaN epitaxial layer 550 can be 0.5 µm, or between 0.3 µm and 0.7 µm.

A metallic structure 540 can be coupled with the GaN substrate 510. The metallic structure 540 can be one or more layers of ohmic metal that serve as a gate contact of the vertical JFET 500. For example, the metallic structure 540 can comprise a titanium-aluminum (Ti/Al) ohmic metal. Other metals and/or alloys can be used including, but not limited to, aluminum, nickel, gold, combinations thereof, or the like. In some embodiments, an outermost metal of the metallic structure 540 can include gold, tantalum, tungsten, palladium, silver, or aluminum, combinations thereof, and the like. The metallic structure 540 can be formed using any of a variety of methods such as sputtering, evaporation, or the like.

Additional metallic structures 560 may be coupled to the second GaN epitaxial layer 530. The additional metallic structures 560 serve as gate contacts for the vertical JFET 500 and can be one or more layers of ohmic metal including metals and/or alloys similar to the metallic structure 540. The additional metallic structures 560 can be formed using a variety of techniques, including lift-off and/or deposition with subsequent etching, which can vary depending on the metals used. Example metals include nickel-gold (Ni/Au), Pd, Pt, and the like.

Finally, further metallic structures 570, 590 can be coupled to the additional metallic structures 560 and the GaN epitaxial structure 550, respectively, as illustrated. These further metallic structures 570, 590 can be formed using the same techniques used to form the additional metallic structures 560, and also can comprise similar metals and/or alloys. Because additional metallic structures 560 can sufficiently form contacts to the second GaN epitaxial layer 530, the additional metallic structures 570 can be omitted, if desired. The further metallic structure 590 formed on the GaN epitaxial structure 550 can serve as a source contact for the vertical JFET 500.

The techniques for controlling the density of carbon in GaN semiconductor devices provided by embodiments of the present invention will enable the fabrication of epitaxial layers such as the GaN channel region 580 with improved electrical performance in comparison with conventional techniques. In addition to the illustrated SBD 400 and vertical JFET 500, other embodiments can be used to fabricate epitaxial layers used in P-i-N diodes, merged P-i-N Schottky (MPS) diodes, thyristors, and a number of other transistor and diode variations. One of ordinary skill in the art would recognize many variations, modifications, and alternatives.

Although embodiments of the present invention have been discussed in the context of doping control of drift regions that are vertically defined by epitaxial growth to produce a drift region with a finely controlled low doping level, embodiments of the present invention are not limited to this particular geometry. In another possible configuration, the drift region is laterally defined by device fabrication, for example by gate to drain spacing in a field effect transistor. In another example the drift region includes the substrate, which is appropriately doped. One of ordinary skill in the art would recognize many variations, modifications, and alternatives.

Moreover, although some embodiments of the present invention are illustrated in terms of a vertical FET, embodiments of the present invention are not limited to this particular device design and the methods and systems described herein are applicable to a wide variety of electrical devices and particularly devices utilizing vertical current flow. For example, epitaxial layers with controllable levels of dopant incorporation are applicable to other vertical or lateral devices utilizing drift layers, semiconductor resistors, isolation regions, or the like. These devices include Schottky diodes and devices integrating the various transistor and diodes described herein.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method of growing an n-type III-nitride-based epitaxial layer, the method comprising:
   providing a substrate in an epitaxial growth reactor;
   forming a masking material coupled to a portion of a surface of the substrate;
   flowing a first gas into the epitaxial growth reactor, wherein the first gas includes a group III element and carbon; and
   flowing a second gas into the epitaxial growth reactor, wherein the second gas includes a group V element, wherein a molar ratio of the group V element to the group III element is at least 5,000; and
   growing the n-type III-nitride-based epitaxial layer.

2. The method of claim 1 wherein growing the n-type III-nitride-based epitaxial layer comprises a selective regrowth.

3. The method of claim 1 wherein the masking material comprises an oxide.

4. The method of claim 1 wherein the first gas comprises at least one of tri-methyl gallium or tri-ethyl gallium.

5. The method of claim 1 wherein the second gas comprises ammonia.

6. The method of claim 1 wherein the n-type III-nitride-based epitaxial layer has a carbon concentration less than $1 \times 10^{16}$ cm$^{-3}$.

7. The method of claim 1 wherein a growth rate of the n-type III-nitride-based epitaxial layer is between 1 μm/hr and 2 μm/hr.

8. The method of claim 1 wherein the n-type III-nitride-based epitaxial layer comprises a channel region of a vertical JFET.

9. A method of manufacturing a vertical JFET, the method comprising:
   providing an n-type GaN-based substrate having a surface and a first electrical contact opposing the surface;
   forming an epitaxial n-type drift layer coupled to at least a portion of the n-type GaN-based substrate and operable to conduct current in a direction substantially orthogonal to the surface;
   forming a masking material coupled to a portion of the epitaxial n-type drift layer;
   forming an n-type channel structure coupled to the epitaxial n-type drift layer, wherein gases including a group V element and a group III element used in forming the n-type channel structure are adjusted such that a molar ratio of the group V element to the group III element is at least 5,000;
   forming an n-type contact layer coupled to the n-type channel structure and substantially parallel to the surface;
   forming a second electrical contact electrically coupled to the n-type contact layer;
   forming a p-type gate region electrically coupled to the n-type channel structure; and
   forming a third electrical contact electrically coupled to the p-type gate region.

10. The method of claim 9 wherein a concentration of carbon in the n-type channel structure is less than $1 \times 10^{16}$ cm$^{-3}$.

11. The method of claim 9 wherein the molar ratio of the group V element to the group III element is at least 10,000.

12. The method of claim 9 wherein a thickness of the epitaxial n-type drift layer is greater than 1 μm.

13. The method of claim 9 wherein a concentration of carbon in the epitaxial n-type drift layer is less than $1 \times 10^{16}$ cm$^{-3}$.

14. The method of claim 9 wherein a growth rate of the n-type channel structure is between 1 μm/hr and 2 μm/hr.

15. A method of growing an n-type GaN-based epitaxial layer, the method comprising:
   placing a GaN-based substrate in an MOCVD reactor;
   forming an oxide coupled to a portion of a surface of the GaN-based substrate;
   flowing a gas containing gallium and carbon into the MOCVD reactor; and
   flowing a gas containing nitrogen into the MOCVD reactor, wherein a molar ratio of nitrogen to gallium is at least 5,000; and
   growing the n-type GaN-based epitaxial layer.

16. The method of claim 15 wherein the gas containing nitrogen comprises at least one of ammonia or cracked ammonia.

17. The method of claim 15 wherein the gas containing gallium comprises at least one of tri-methyl gallium, tri-ethyl gallium, cracked tri-methyl gallium, or cracked tri-ethyl gallium.

18. The method of claim 15 wherein the n-type GaN-based epitaxial layer has a carbon concentration less than $1 \times 10^{16}$ cm$^{-3}$.

19. The method of claim 15 wherein a growth rate of the n-type GaN-based epitaxial layer is between 1 μm/hr and 2 μm/hr.

20. The method of claim 15 wherein the n-type GaN-based epitaxial layer comprises a channel region of a vertical JFET.

21. The method of claim 15 wherein the GaN-based substrate comprises an n-type GaN substrate.

* * * * *